(12) United States Patent
Ahn

(10) Patent No.: US 6,496,077 B2
(45) Date of Patent: Dec. 17, 2002

(54) PHASE DETECTOR FOR AUTOMATICALLY CONTROLLING OFFSET CURRENT AND PHASE LOCKED LOOP INCLUDING THE SAME

(75) Inventor: Tae-won Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 09/838,024

(22) Filed: Apr. 19, 2001

(65) Prior Publication Data

US 2002/0060610 A1 May 23, 2002

(30) Foreign Application Priority Data

Nov. 23, 2000 (KR) .............................................. 00-70010

(51) Int. Cl.[7] ................................................. H03L 7/00
(52) U.S. Cl. ............................................. 331/27; 327/7
(58) Field of Search ........................ 331/27, 25; 327/7, 327/2, 3, 8

(56) References Cited

U.S. PATENT DOCUMENTS 5,446,411 A * 8/1995 Horsfall et al. ............. 329/325
6,091,303 A * 7/2000 Dent ........................... 327/147
6,163,585 A * 12/2000 Yamawaki et al. .......... 327/142
6,259,755 B1 * 7/2001 O'Sullivan et al. ......... 370/503

* cited by examiner

Primary Examiner—Robert Pascal
Assistant Examiner—Joseph Chang
(74) Attorney, Agent, or Firm—F. Chau & Associates, LLP

(57) ABSTRACT

A phase detector includes a Gilbert block for outputting a signal proportional to a phase difference between first and second input signals to a first output terminal, and a current source for determining a current in the first output terminal. The current source is controlled by a reference current signal. A converter outputs a current to a second output terminal in response to the signal output from the first output terminal. A variable current source varies the current output to the second output terminal. A controller controls the variable current source in response to the first and second input signals.

14 Claims, 3 Drawing Sheets

PHASE DETECTOR FOR AUTOMATICALLY CONTROLLING OFFSET CURRENT AND PHASE LOCKED LOOP INCLUDING THE SAME

BACKGROUND OF THE INVENTION

1. Technical Field

The present invention relates generally to a phase-locked loop (PLL) and, more particularly, to a phase detector for self-controlling offset current: and to a PLL including the same.

2. Description of Related Art

Semiconductor devices that operate in synchronization with an external clock, such as semiconductor memories or central processing units (CPUs), generate an internal clock using a clock buffer-and a clock driver. The internal clock is delayed a predetermined period of time in comparison to the external clock, thus degrading high frequency operating characteristics of such semiconductor devices.

That is, an access time period required to output data after an external clock has been input is always longer than a time period required to generate an internal clock after the external clock has been generated, thus adversely affecting the speed of a semiconductor memory device. To avoid such low performance of a semiconductor memory device, a PLL is required to accurately synchronize an internal clock with an external clock.

Typically, a PLL is a nonlinear analog device that uses a negative feedback loop to make the phase difference between an input signal and an output signal smaller or, preferably, approximately equal to zero. The phase difference between both signals becomes smaller and smaller, which also makes the frequency of both signals equal. PLLs are widely used as an indispensable interface for clock synchronization in high-speed communication systems or semiconductor memory systems. FIG. 1 is a block diagram of a conventional PLL. The PLL includes a phase detector (PD) 3, a loop filter 5, and a voltage controlled oscillator (VCO) 7.

The PD 3 senses a phase difference between an external clock MODOUT and an internal clock MIXOUT output from the VCO 7 and outputs a current signal PDOUT corresponding to the phase difference to the loop filter 5. The loop filter 5, in turn, outputs a DC component that excludes an AC component in response to the output signal PDOUT of the PD 3. The VCO 7 outputs the internal clock MIXOUT in response to the output signal of the loop filter S.

FIG. 2 is the circuit diagram of the PD 3 shown in FIG. 1. The PD 3 includes a Gilbert multiplier cell or Gilbert core block 11. The mixer-type PD 3 using the Gilbert core block 11 has a drawback in that it cannot reduce the difference in frequency between an external clock MODout and an internal clock MIXout when the phase is out of lock.

Conventionally, to overcome such a drawback, an offset current source 10 continuously outputs a constant offset current to node n3 that is proportional to a reference; current signal Iref from an initial operation of the PLL, thus sweeping down the frequency of the internal clock to be in lock with the external clock and controlling the locking time.

However, since the conventional phase detector 3 of FIG. 2 (and a PLL including the same) outputs a constant offset current to the node n3 when the PLL is in lock, unnecessary current is consumed and repeated determination must be made to identify an optimum offset current.

SUMMARY OF THE INVENTION

To solve the above and other related problems of the prior art, there is provided a phase detector and a phase-locked loop (PLL) including the same. The phase detector (and PLL) locks phase quickly and steadily while reducing unnecessary offset current.

According to an aspect of the invention, there is provided a phase detector that includes a Gilbert Cell, a converter, a variable current source, and a variable current source controller. The Gilbert cell includes a Gilbert core block for outputting a signal proportional to a phase difference between first and second input signals to a first output terminal, and a current source for determining a current flowing in the first output terminal. The current source is controlled by a reference current signal. The converter outputs a current to a second output terminal in response to the signal output from the first output terminal. The variable current source varies the current output to the second output terminal. The variable current source controller controls the variable current source in response to the first and second input signals.

Preferably, the variable current source controller includes a counter for outputting a number of first edges of the first input signal that exist between first edges of first and second clock pulses of the second input signal. Moreover, it is preferable if the variable current source outputs a current proportional to an output signal of the variable current source controller and the reference current signal.

These and other aspects, features and advantages of the present invention will become apparent from the following detailed description of preferred embodiments, which is to be read in connection with the accompanying drawings.

Figure 1:
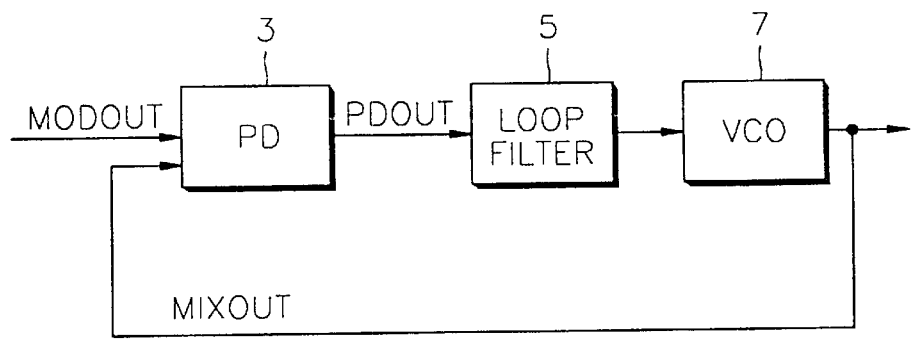
FIG. 1 is a block diagram showing a conventional phase-locked loop.
Figure 2:
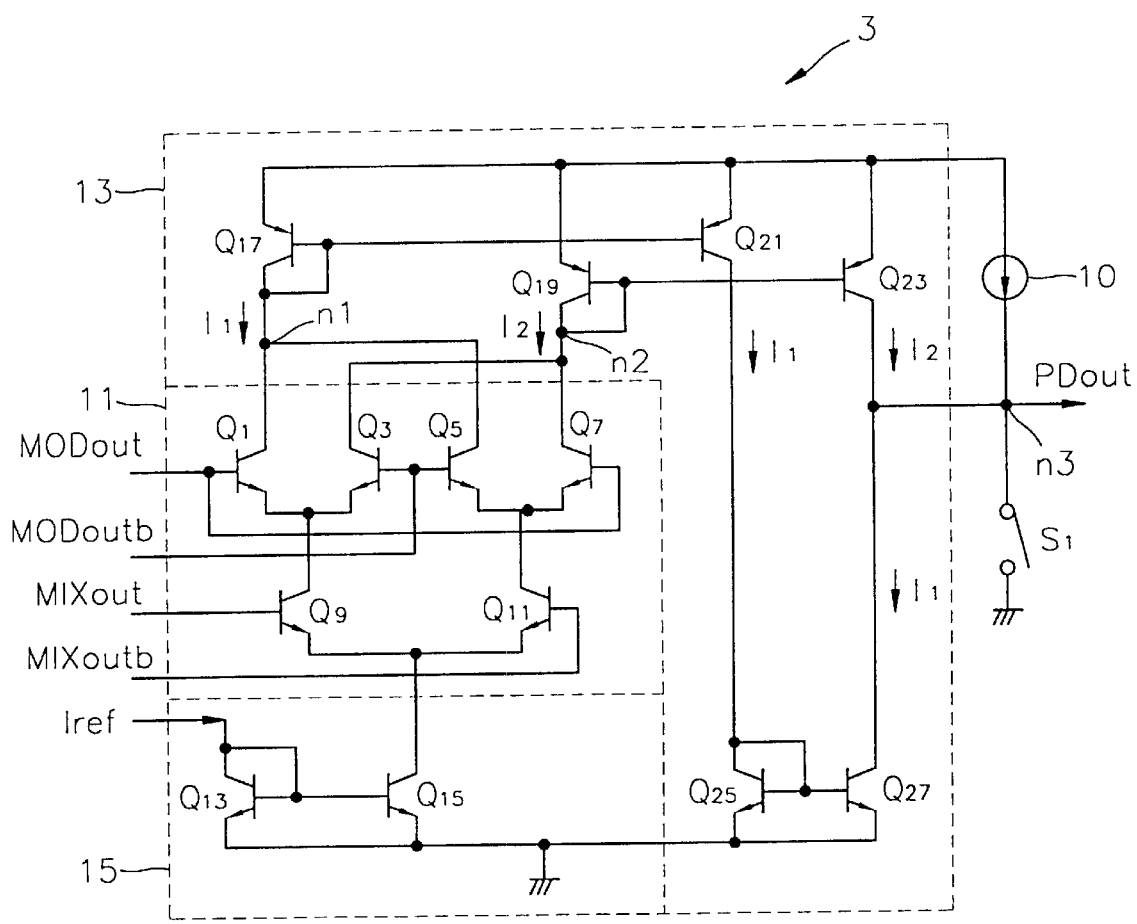
FIG. 2 is a circuit diagram showing the phase detector of FIG. 1.

DETAILED DESCRIPTION OF PREFERRED EMBODIMENTS,

The present invention will now be described more, fully with reference to the accompanying drawings, in which preferred embodiments of the invention are shown. The same reference numerals appearing in different drawings represent the same or similar element.

Figure 3:
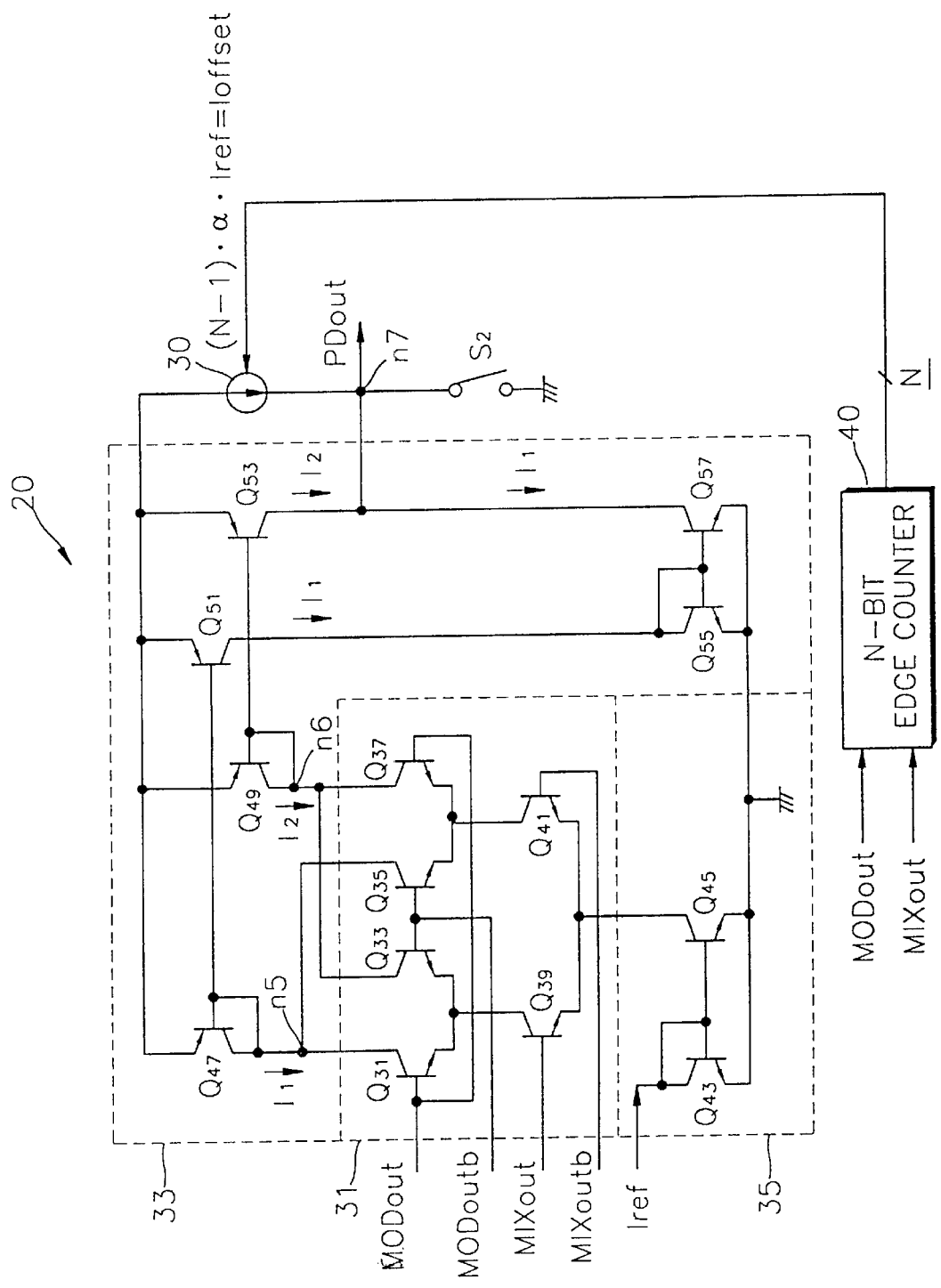
FIG. 3 is a circuit diagram showing a phase detector, according to an illustrative embodiment of the present invention.

FIG. 3 is a circuit diagram showing a phase detector (PD) 20, according to an illustrative embodiment of the present invention. The phase detector (PD) 20 includes a Gilbert core block 31, a converter 33, a variable current source 30, a switch S2, and a variable current source controller 40. The Gilbert core block 31 includes a pair of emitter-coupled transistors Q39 and Q41 collectively referred to as a "driver transistor" or a "lower transistor", and a pair of cross-coupled emitter-coupled transistor pairs Q31 and Q33, and Q35 and Q37, which are collectively referred to as an "upper transistor", a "switch", or "an active mixer transistor".

When first differential input signals MODout and MODoutb are respectively input to bases of the transistors Q31 and Q37 and to bases of the transistors Q33 and Q35, and second differential input signals MIXout and MIXoutb are respectively input to bases of the transistors Q39 and Q41, output terminals n5 and n6 output a voltage signal proportional to the phase difference between the first and second input signals MODout and MIXout. Also, the PD 20 further includes a current source 35 comprised of a current mirror. The current mirror includes transistors Q45 and Q43. The transistor Q45 has a collector coupled to the emitters of the pair of emitter-coupled transistors Q39 and Q41 and an emitter coupled to a ground voltage. The transistor Q43 has a collector, to which a reference current signal Iref is input, and a base and a collector coupled to the base of the transistor Q45.

Since the bases and the emitters of the transistors Q43 and Q45 in the current source 35 are shared, current which is substantially the same as the reference current signal Iref input to the collector of the transistor Q43 also flows in the collector of the transistor Q45, if the areas of the emitters of the transistors Q43 and Q45 are the same. Thus, assuming that current I1 and I2 flow in the nodes n5 and n6, respectively, current flowing in the collector of the transistor Q45 equals the sum Iref of the current I1 and I2. Thus, the current I1 and I2 respectively flowing in the nodes n5 and n6 can be determined by the reference current signal Iref.

The converter 33 includes a plurality of current mirrors. That is, since the current I1 flowing in the node n5 is mirrored to a collector of transistor Q51 by transistors Q47 and Q51, current I1 flows in the collector of the transistor Q51. Furthermore, since the current I2 flowing in the node n6 is mirrored to a collector of transistor Q53 by the transistors Q49 and Q53, the current I2 flows in the collector of the transistor Q53. Also, current I1 flowing in a collector of transistor Q55 is mirrored to a.collector of transistor Q57 by the transistors Q55 and Q57. Thus, current flowing in node n7, which is the output terminal of the PD 20, equals the difference between the current I1 and I2 flowing in the nodes n5 and n6, respectively.

Figure 4:
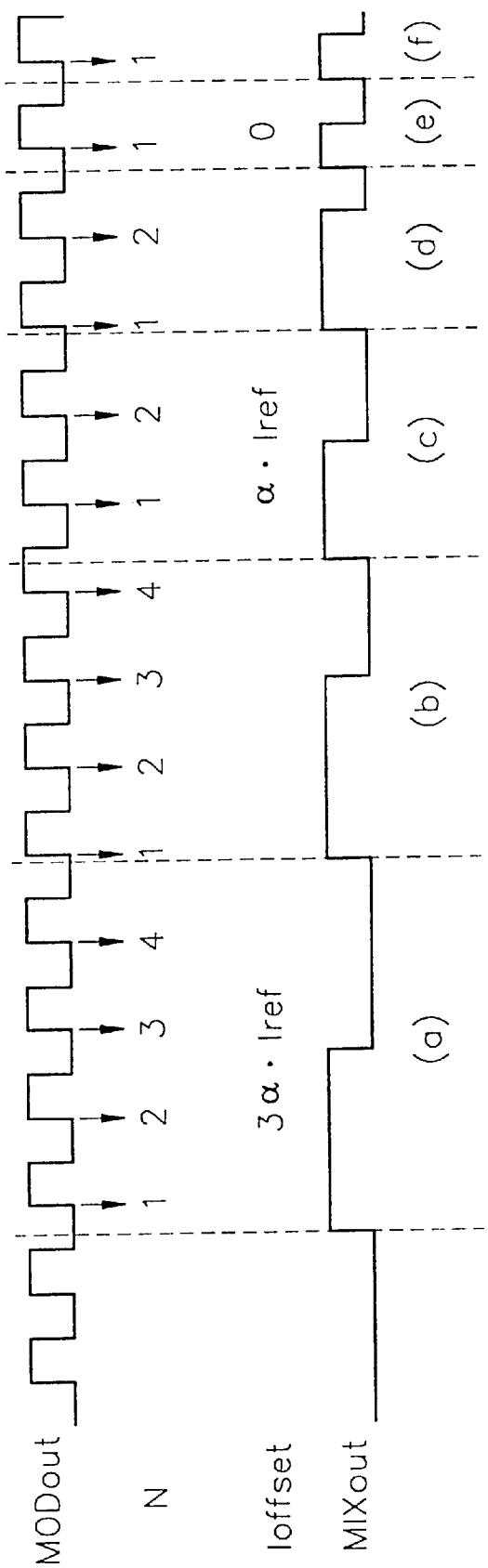
FIG. 4 is a timing diagram showing input and output waveforms of the phase detector of FIG. 3, according to an illustrative embodiment of the present invention.

FIG. 4 is a timing diagram showing input and output waveforms of the phase detector of FIG. 3, according to an illustrative embodiment of the present invention. An example in which offset current is automatically controlled will now be described with reference to FIGS. 3 and 4.

The variable current source controller 40 may be comprised of an N-bit edge counter. The N-bit edge counter outputs the number N of first edges (rising edges) of the first input signal MODout existing between a first edge (rising edge, for example) of an arbitrary clock pulse of the second input signal MIXout and a first edge (rising edge, for example) of the next clock pulse. For example, in interval (a) of FIG. 4, a clock of the first input signal MODout has four rising edges between the rising edges of first and second clock pulses of the second input signal MIXout. In interval (e) of FIG. 4, a clock pulse of the first input signal MODout has one rising edge between the rising edges of fifth and sixth clock pulses of the second input signal MIXout.

Current Ioffset of the variable current source 30 is expressed by Equation (1):

$$I\text{offset} = (N-1) \times \alpha \times I\text{ref} \quad (1)$$

where α denotes the coefficient of current output to the output terminal of the PD 20, that is, the node n7, and is an adjustable real number in the range of 0.35 to 0.45.

Thus, the variable current source 30 outputs offset current corresponding to 3αIref in intervals (a) and (b), while it outputs no offset current in the intervals (e) and (f).

The switch S2 is a switch for resetting the PD 20. Furthermore, a phase-locked loop (PLL) including the PD 20 according to the embodiment of the present invention is not shown because the PLL has basically the same configuration as the PLL shown in FIG. 1. The PD 20 senses the phase difference between an external clock MODOUT and an internal clock MIXOUT output from the VCO and outputs a current signal PDout to the loop filter.

The current signal PDout output from the PD 20 according to the present invention is expressed by Equation (2):

$$PD\text{out} = I2 - I1 + (N-1)\alpha I\text{ref} \quad (2)$$

The loop filter outputs a DC component that excludes an AC component in response to the output signal PDout of the PD 20. The VCO outputs the internal clock MIXOUT in response to the output signal of the loop filter.

For example, if the number N, which is the output of the variable current source controller 40, is equal to 1, then the variable current source 30 according to the present invention outputs an offset current of 0 to the node n7.

Accordingly, the PD and the PLL including the same quickly detects the phase and automatically controls offset current so as to stably maintain a lock state, thereby consuming less current than the conventional PD and PLL.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A phase detector comprising:
    a Gilbert Cell including,
        a Gilbert core block for outputting a signal proportional to a phase difference between first and second input signals to a first output terminal, and
    a current source for determining a current flowing in the first output terminal, the current source being controlled by a reference current signal;
    a converter for outputting a current to a second output terminal in response to the signal output to the first output terminal;
    a variable current source for varying the current output to the second output terminal; and
    a variable current source controller for controlling at the variable current source in response to the first and second input signals.

2. The phase detector of claim 1, further comprising a switch, coupled between the second output terminal and a ground voltage, for coupling the second output terminal to the ground voltage to reset the second output terminal.

3. The phase detector of claim 2, wherein the variable current source controller comprises a counter for outputting a number of first edges of the first input signal that exist between first edges of first and second clock pulses of the second input signal.

4. The phase detector of claim 1, wherein the variable current source outputs a current proportional to an output signal of the variable current source controller and the reference current signal.

5. In a phase-locked loop that includes a loop filter for outputting a direct current component and a voltage controlled oscillator for outputting an internal clock signal in response to the direct current component, a phase detector comprises:

a Gilbert Cell including,
    a Gilbert core block for outputting a signal proportional to a phase difference between an external clock signal and the internal clock signal to a first output terminal, and
    a current source for determining a current flowing in the first output terminal, the current source being controlled by a reference current signal;
a converter for outputting a current to a second output terminal in response to the signal output to the first output terminal;
a variable current source for varying the current. output to the second output terminal; and
a variable current source controller for controlling the variable current source in response to the external and internal clock signals,
wherein the direct current component is output from the loop filter in response to the signal output to the second output terminal.

6. The phase-locked loop of claim 5, wherein the phase detector further comprises a switch, coupled between the second output terminal and a ground voltage, for coupling the second output terminal to the ground voltage to reset the second output terminal.

7. The phase-locked loop of claim 5, wherein the variable current source controller includes a counter'that outputs a number of first edges of the external clock signal that exist between first edges of adjacent clock pulses with respect to the external clock signal.

8. The phase-locked loop of claim 5, wherein the variable current source outputs a current proportional to an output signal of the variable current source controller and the reference current signal.

9. A phase detector comprising:
a Gilbert Cell including,
    a Gilbert core block having first output terminals for outputting there between a phase difference signal proportional to a phase difference between first and second input signals, and
    a current source for determining currents flowing in the first output terminals, the current source being controlled by a reference current signal Iref;
a converter for outputting a current to an output terminal of the phase detector in response to the phase difference signal, the current being proportional to the currents flowing in the first output terminals;
a variable current source that varies the current output to the output terminal of the phase detector; and
a variable current source controller for determining a number N of first edges of the first input signal that exist between first edges of first and second clock pulses of the second input signal, and for outputting a control signal to the variable current source based on the determined number N.

10. The phase detector of claim 9, further comprising a switch, coupled between the output terminal of the phase detector and a ground voltage, for coupling the output terminal of the phase detector to the ground voltage.

11. The phase detector of claim 9, wherein the variable current source outputs a current proportional to the control signal output from the variable current source controller and the reference current signal Iref.

12. The phase detector of claim 11, wherein the current output from the variable current source is equal to $$(N-1) \times \alpha \times Iref$$

where $\alpha$ denotes a coefficient of current output to the output terminal of the phase detector.

13. The phase detector of claim 9, wherein a sum of the currents flowing in the first output terminals is equal to the reference current signal Iref.

14. The phase detector of claim 13 wherein the current output to the output terminal of the phase detector is equal to a difference between the currents flowing in the first output terminals.

* * * * *